United States Patent
Hueber et al.

(10) Patent No.: US 10,735,115 B2
(45) Date of Patent: Aug. 4, 2020

(54) METHOD AND SYSTEM TO ENHANCE ACCURACY AND RESOLUTION OF SYSTEM INTEGRATED SCOPE USING CALIBRATION DATA

(71) Applicant: NXP B.V., Eindhoven (NL)

(72) Inventors: Gernot Hueber, Linz (AT); Ian Thomas Macnamara, Graz (AT)

(73) Assignee: NXP B.V., San Jose, CA (US)

(*) Notice: Subject to any disclaimer, the term of this patent is extended or adjusted under 35 U.S.C. 154(b) by 0 days.

(21) Appl. No.: 16/050,929

(22) Filed: Jul. 31, 2018

(65) Prior Publication Data
US 2020/0044754 A1  Feb. 6, 2020

(51) Int. Cl.
| | | |
|---|---|---|
| H04B 17/21 | (2015.01) | |
| G01R 31/28 | (2006.01) | |
| G06F 7/48 | (2006.01) | |
| G06F 7/544 | (2006.01) | |
| H03M 1/10 | (2006.01) | |
| H04B 1/00 | (2006.01) | |

(52) U.S. Cl.
CPC ......... *H04B 17/21* (2015.01); *G01R 31/2822* (2013.01); *G06F 7/4818* (2013.01); *G06F 7/5446* (2013.01); *H03M 1/108* (2013.01); *H04B 1/0017* (2013.01)

(58) Field of Classification Search
CPC .................................................. H03M 1/1009
See application file for complete search history.

(56) References Cited

U.S. PATENT DOCUMENTS

| | | | |
|---|---|---|---|
| 4,495,586 A | | 1/1985 | Andrews |
| 4,694,244 A | | 9/1987 | Whiteside et al. |
| 4,908,621 A | * | 3/1990 | Polonio ............... H03M 1/1052 341/118 |

(Continued)

FOREIGN PATENT DOCUMENTS

| | | |
|---|---|---|
| EP | 3035625 A1 | 6/2016 |
| EP | 3280061 A1 | 2/2018 |

(Continued)

OTHER PUBLICATIONS

"Oscilloscope Fundamentals", Tektronix, 60 pgs., retrieved from the internet at: https://engineering.case.edu/lab/circuitslab/sites/engineering.case.edu.lab.circuitslab/files/docs/Oscilloscope_Fundamentals_-_Tektronix.pdf (Oct. 2008).

(Continued)

*Primary Examiner* — Cindy Trandai (57) ABSTRACT

This specification discloses methods and systems for implementing a chip integrated scope (i.e., chip scope (CS)), which is a feature that allows a user to scope RF signals (internally and externally to the DUT (device under test)), by using the RF receive path (including amplifier, filter, ADC, DSP) to capture and store signal traces. In some embodiments, this specification discloses methods and systems to enhance the resolution and accuracy of these signal traces by using raw and correction data for gain/phase compensation of gain/phase impairments introduced in the Rx (receiver) path. In some embodiments, the correction data is generated from one or more of the following: simulation data, characterization data, production test data.

19 Claims, 7 Drawing Sheets

(56) References Cited

U.S. PATENT DOCUMENTS

| | | | |
|---|---|---|---|
| 5,220,589 A * | 6/1993 | Gard | A61B 6/032 378/19 |
| 5,260,670 A | 11/1993 | Ainsworth et al. | |
| 5,901,003 A * | 5/1999 | Chainer | G11B 5/5565 360/51 |
| 6,154,682 A | 11/2000 | Yi | |
| 6,856,924 B2 | 2/2005 | MacDonald | |
| 7,227,479 B1 | 6/2007 | Chen et al. | |
| 8,310,387 B2 | 11/2012 | Harris et al. | |
| 8,890,739 B2 | 11/2014 | Lewis et al. | |
| 9,620,227 B1 * | 4/2017 | Battaje | G11C 16/16 |
| 9,793,910 B1 | 10/2017 | Devarajan | |
| 9,874,587 B1 * | 1/2018 | Holcomb | G01R 13/0254 |
| 9,887,760 B1 * | 2/2018 | Sridharan | H04B 7/0617 |
| 10,103,753 B1 * | 10/2018 | Nagarajan | H03M 13/1145 |
| 2002/0167418 A1 * | 11/2002 | Goswami | G01V 11/002 340/853.3 |
| 2005/0140546 A1 | 6/2005 | Park et al. | |
| 2006/0194552 A1 | 8/2006 | Jin et al. | |
| 2007/0207757 A1 * | 9/2007 | Qi | H04B 17/20 455/226.1 |
| 2009/0007661 A1 * | 1/2009 | Nasiri | G01P 1/023 73/504.03 |
| 2009/0160569 A1 * | 6/2009 | Gros | G04G 3/02 331/176 |
| 2009/0310651 A1 | 12/2009 | Amde et al. | |
| 2010/0289679 A1 * | 11/2010 | Dasnurkar | H03M 1/1095 341/120 |
| 2011/0098964 A1 * | 4/2011 | Mullane | H03M 1/1085 702/123 |
| 2012/0050082 A1 * | 3/2012 | Danesh | H03M 1/1215 341/122 |
| 2012/0206282 A1 * | 8/2012 | Gorbold | G01R 31/3167 341/120 |
| 2013/0021048 A1 * | 1/2013 | Peng | G01R 31/2822 324/750.3 |
| 2013/0294490 A1 * | 11/2013 | Chandrasekaran | H04L 7/0079 375/226 |
| 2014/0085057 A1 | 3/2014 | Horst et al. | |
| 2014/0154997 A1 * | 6/2014 | Chen | H04B 3/46 455/67.14 |
| 2014/0281658 A1 * | 9/2014 | Kelly | G06F 1/08 713/502 |
| 2016/0050034 A1 | 2/2016 | Pearse et al. | |
| 2016/0109327 A1 * | 4/2016 | Viswanathan | G01M 11/3145 356/73.1 |
| 2016/0197684 A1 * | 7/2016 | Tsai | H04B 17/0085 455/67.14 |
| 2016/0204881 A1 * | 7/2016 | Chung | H04B 17/00 455/67.14 |
| 2016/0211861 A1 * | 7/2016 | Op 't Eynde | H03M 1/1038 |
| 2016/0248459 A1 * | 8/2016 | Gan | H04B 1/109 |
| 2016/0329972 A1 * | 11/2016 | Dominizi | H04B 17/0085 |
| 2016/0356820 A1 | 12/2016 | Ausserlechner | |
| 2017/0331487 A1 * | 11/2017 | Kim | H03M 1/1014 |
| 2018/0059215 A1 * | 3/2018 | Turbiner | G01S 15/931 |
| 2018/0138919 A1 * | 5/2018 | Bjork | H03M 1/1004 |
| 2018/0175873 A1 * | 6/2018 | Ramakrishnan | H03M 1/1042 |
| 2018/0313864 A1 * | 11/2018 | Oshio | G01P 1/006 |
| 2019/0025372 A1 * | 1/2019 | Waelchli | G11C 29/56012 |

FOREIGN PATENT DOCUMENTS

| | | |
|---|---|---|
| WO | 97/44892 A1 | 11/1997 |
| WO | 2007/146090 A2 | 12/2007 |
| WO | 2017/070681 A1 | 4/2017 |

OTHER PUBLICATIONS

Chen, T.-M. et al. "A 2×2 MIMO 802.11 abgn/ac WLAN SoC with integrated T/R switch and on-chip PA delivering VHT80 256QAM 17.5dBm in 55nm CMOS", IEEE Radio Frequency Integrated Circuits Symposium, 4 pgs. (Jun. 2014).

Chung, Y.-H. et al. "A Dual-Brand 802.11abgn/ac Transceiver with Integrated PA and T/R Switch in a Digital Noise Controlled SoC", IEEE Custom Integrated Circuits Conference, 8 pgs. (2015).

Notice of Allowance for U.S. Appl. No. 16/120,210, dated Apr. 3, 2019, 16 pages.

* cited by examiner

METHOD AND SYSTEM TO ENHANCE ACCURACY AND RESOLUTION OF SYSTEM INTEGRATED SCOPE USING CALIBRATION DATA

FIELD

The described embodiments relate generally to methods and devices that provide for a chip integrated scope, and more particularly to methods and devices that provide for a chip integrated scope with enhanced accuracy and resolution.

BACKGROUND

The use of an external instrument (i.e., external to a device or chip under test), such as an oscilloscope, to scope the device or chip under test for analyzing and debugging corner or error cases is very important. Such an instrument can be a very powerful tool that is used to locate some of the most complex and inconspicuous hardware and software defects.

Therefore, there are strong motivations to develop other methods and systems to perform the important task of scoping the device or chip under test for analyzing and debugging corner or error cases.

SUMMARY

This specification discloses methods and systems for implementing a chip integrated scope (i.e., chip scope (CS)), which is a feature that allows a user to scope RF signals (internally and externally to the DUT (device under test)), by using the RF receive path (including amplifier, filter, ADC, DSP) to capture and store signal traces. In some embodiments, this specification discloses methods and systems to enhance the resolution and accuracy of these signal traces by using raw and correction data for gain/phase compensation of gain/phase impairments introduced in the Rx (receiver) path. In some embodiments, the correction data is generated from one or more of the following: simulation data, characterization data, production test data.

The present invention provides for a device for receiving a RF (radio frequency) signal and converting the RF signal to a digital data sample, the device comprising: (a) a digital data memory; (b) a receiver, the receiver configured to providing a raw digital data sample to the digital data memory; (c) a correction data memory configured to store correction data, wherein the correction data is used to compensate for circuit variations occurring between different units of the device; (d) a CS (chip scope) control unit, the CS control unit configured to receive inputs from the receiver, the CS control unit further configured to using the inputs to determine an appropriate subset of the correction data to apply to the raw digital data sample to compensate for circuit variations.

In some embodiments, the raw digital data sample is a RF signal trace, wherein the inputs from the receiver are information related to a state of the receiver.

In some embodiments, the circuit variations are due to gain, phase, and/or non-linearities errors from functional blocks in the receiver.

In some embodiments, the receiver is configured for receiving the RF signal for an NFC-enabled device, wherein NFC stands for near field communication.

In some embodiments, the receiver is comprised of: (a) a down converter, (b) an ADC (analog to digital converter).

In some embodiments, the receiver is further comprised of one or more of the following: (c) an attenuator, (d) a BBA (baseband amplifier), (e) a filter.

In some embodiments, (a) the down converter is comprised of one or more of the following: (i) a mixer, (ii) a LO (local oscillator), (iii) an I/Q LO unit, (b) wherein the device is further comprised of a CORDIC (Coordinate Rotation Digital Computer), wherein the CORDIC is configured to processing the raw digital data sample from the receiver before sending the raw digital data sample to the digital data memory.

In some embodiments, (a) the CS control unit receives the inputs from one or more of the following functional blocks of the receiver: (i) the attenuator, (ii) the mixer, (iii) the BBA, (iv) the ADC, (b) wherein the inputs from the one or more functional blocks of the receiver are information related to a state of the receiver.

In some embodiments, the raw digital data sample is based on signals the receiver receives from one of the following sources: (a) sources external to the device, (b) sources internal to the device, (c) a combination of sources external to the device and sources internal to the device.

In some embodiments, the receiver receives signals from sources internal to the device via one or more of the following functional blocks of the receiver: (a) the attenuator, (b) the mixer, (c) the BBA, (d) the ADC.

In some embodiments, the appropriate subset of the correction data is applied to the raw digital data sample to generate a compensated digital data sample, wherein the compensated digital data sample is then directly available as an immediate output from the device or the compensated digital data sample is stored in the digital data memory for future output.

In some embodiments, the appropriate subset of the correction data is stored together with the raw digital data sample in the digital data memory so that a post processing step is needed to generate a compensated digital data sample.

In some embodiments, the appropriate subset of the correction data is applied to the raw digital data sample to generate a compensated digital data sample using one of the following methods: (a) hardware, (b) software, (c) a combination of hardware and software.

In some embodiments, each of the appropriate subset of the correction data is pre-processed to become a single compensation value that can be applied to the raw digital data sample.

In some embodiments, the correction data is generated from one or more of the following: (a) simulation data, (b) characterization data, (c) production test data.

In some embodiments, a temperature sensor detects a temperature of the device, wherein the temperature of the device is used for determining the appropriate subset of the correction data to applied to the raw digital data sample.

The present invention also provides for a method to enhance accuracy and resolution of a chip integrated scope of a device, the method comprising: (a) using a receiver of the device to receive an RF (radio frequency) signal; (b) converting the RF signal to a raw digital data sample; (c) using a CS (chip scope) control unit of the device to receive inputs from the receiver, (d) using the inputs to the CS control unit to determine an appropriate subset of correction data to apply to the raw digital data sample to compensate for circuit variations occurring between different units of the receiver.

In some embodiments, the raw digital data sample is a RF signal trace, wherein the inputs from the receiver are information related to a state of the receiver.

In some embodiments, the method further comprising: (e) applying the appropriate subset of the correction data to the raw digital data sample to generate a compensated digital data sample, wherein the compensated digital data sample is then directly available as an immediate output from the device or the compensated digital data sample is stored in a digital data memory for future output.

The present invention provides for a computer program product comprising executable instructions encoded in a non-transitory computer readable medium which, when executed by a system, carry out or control the following method to enhance accuracy and resolution of a chip integrated scope of a device, the method comprising: (a) using a receiver of the device to receive an RF (radio frequency) signal; (b) converting the RF signal to a raw digital data sample; (c) using a CS (chip scope) control unit of the device to receive inputs from the receiver, (d) using the inputs to the CS control unit to determine an appropriate subset of correction data to apply to the raw digital data sample to compensate for circuit variations occurring between different units of the receiver.

The above summary is not intended to represent every example embodiment within the scope of the current or future Claim sets. Additional example embodiments are discussed within the Figures and Detailed Description below. Other aspects and advantages of embodiments of the present invention will become apparent from the following detailed description taken in conjunction with the accompanying drawings.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Many systems, such as a RF (radio frequency) receiver system, can be implemented on a chip. As such, a system integrated scope can be characterized as a chip integrated scope. The chip integrated scope (i.e., chip scope (CS)) is a feature that allows a user to scope RF signals (internally and externally to the DUT (device under test)), by using the RF receive path (including amplifier, filter, ADC (analog-to-digital converter), DSP (digital signal processor)) to capture and store signal traces. In some embodiments, this specification discloses methods and systems to enhance the resolution and accuracy of these signal traces by using raw and correction data for gain/phase compensation of gain/phase impairments introduced in the Rx (receiver) path. The expectation is to improve the CS accuracy with no cost of additional silicon area, test time, or design effort. In some embodiments, this improvement in CS accuracy can be from +/−1 dB down to 0.1 dB with no cost of additional silicon area, test time, or design effort.

The CS feature allows a system (e.g., an IC (integrated circuit)) to detect internal or external signals and store the respective traces. In most cases, this feature is a test vehicle, to analyze and debug corner or error cases, or it may be used in test conditions to capture data with high accuracy. An example of such a use case is shown in FIG. 1.

Figure 1:
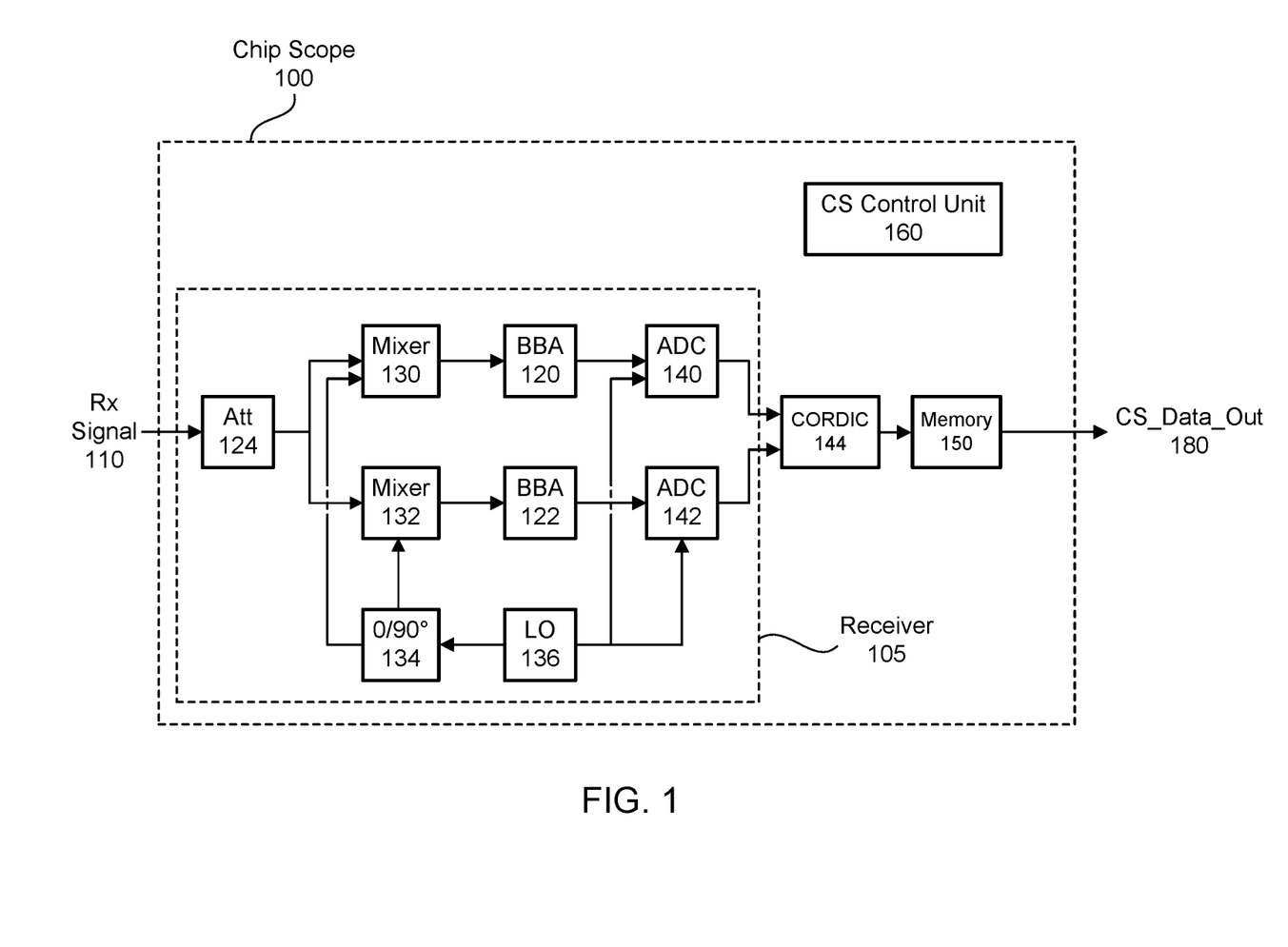
FIG. 1 shows a functional block diagram of a chip integrated scope (i.e., chip scope (CS)) in accordance with some embodiments of the invention.

In this regard, FIG. 1 shows a functional block diagram of a chip integrated scope (i.e., chip scope (CS)) in accordance with some embodiments of the invention. As shown in FIG. 1, a chip scope (CS) 100 includes a CS Control Unit 160, two Mixers (130, 132), two BBA (baseband amplifier) (120, 122), two ADC (analog to digital converter) (140, 142), a CORDIC (Coordinate Rotation Digital Computer) 144, and a memory 150. Please note that all the functional blocks (with the exception of the CS Control Unit 160) are blocks not specific to the CS (since they are actually all from the normal receive path). In other words, the CS does not impose any specific demanding specification on all these functional blocks (with the exception of the CS Control Unit 160).

Additionally, as shown in FIG. 1, the chip scope (CS) 100 also includes an attenuator 124, a LO (local oscillator) 136, and an I/Q LO unit (labeled as a 0/90° unit 134). Also shown in FIG. 1 is that the chip scope (CS) 100 receives a Rx (receiver) signal 110 as input, and then transmits a CS_Data_Out 180 as output. In other words, the CS 100 receives a RF (radio frequency) signal (e.g., Rx signal 110), and then transmits out a digital data sample (e.g., CS_Data_Out 180).

In some embodiments, the chip scope (CS) 100 can be a device for receiving a RF (radio frequency) signal and converting the RF signal to a digital data sample. In some embodiments, the raw digital data sample can be a RF signal trace. In some embodiments, the chip scope (CS) 100 can include: (a) a receiver 105, (b) a CORDIC 144, (c) a CS (chip scope) control unit, and (d) a digital data memory 150. The receiver 105 can be configured to provide a raw digital data sample to the CORDIC 144. Then the CORDIC can be configured to processing the raw digital data sample from the receiver 105 before sending the raw digital data sample to the digital data memory 150. In some embodiments, the receiver 105 can be configured for receiving the RF signal for an NFC-enabled device, wherein NFC stands for near field communication.

FIG. 1 also shows that some of the functional blocks can be grouped together to form a receiver (Rx) 105. As shown in FIG. 1, a receiver (Rx) 105 can include an attenuator 124, a LO (local oscillator) 136, an I/Q LO unit (labeled as a 0/90° unit 134), two Mixers (130, 132), two BBA (baseband amplifier) (120, 122), and two ADC (analog to digital converter) (140, 142).

It is not shown in FIG. 1, but, in some embodiments, a receiver (Rx) can include (a) a down converter, and (b) an ADC (analog to digital converter). In some embodiments, the receiver can further include one or more of the following: (c) a gain stage, and (d) a filter. In some embodiments, the gain stage can include (i) an attenuator, and (ii) a BBA (baseband amplifier). Therefore, in some embodiments, the receiver can further include one or more of the following: (c) an attenuator, (d) a BBA (baseband amplifier), and (e) a filter. In some embodiments, the down converter can include one or more of the following: (i) a mixer, (ii) a LO (local oscillator), and (iii) an I/Q LO unit. In some embodiment, the I/Q LO unit can be a 0/90° unit.

It is not shown in FIG. 1, but, in some embodiments, a chip scope (CS) can allow signals to be introduced at the attenuator or the mixer input. In some embodiments, the signal of interest can also be introduced at the ADC, BBA, mixer, or attenuator inputs (e.g., using a bypass of mixer or BBA, mux (or multiplexer), etc.). This is further shown in FIG. 6.

As the chip scope (CS) can be based on the existing Rx (receive) path, many of the key performance specifications (such as sample rate, resolution, accuracy) are inherited from the existing Rx path. However, in (production) test conditions or debugging, this performance metrics might not be sufficient.

Therefore, if the chip scope (CS) specifications are based on the existing Rx (receive) path specifications, there can be fundamental limits on the chip scope (CS) performance, which in turn will limit the following targeted testing capabilities:

(a) Achieving a chip scope (CS) absolute accuracy of say, for example, less than and equal to 0.1 dB so that the chip scope (CS) can replace an external oscilloscope in a production test. (This has the benefit of reducing test cost, as the DUT (device under test) can now be used as an "oscilloscope" substitute and this in turn replaces an external oscilloscope.)

(b) Using a chip scope (CS) to sample rising/falling edges (and over/undershoots) of a modulation signal to assess waveshape signal quality in, for example, a loopback or DUT-DUT case.

For the above use cases, it is important to improve the accuracy and resolution of a chip scope (CS). As such, this specification discloses methods and systems designed to enhance the performance of the chip scope (CS) based on existing HW (hardware) design. Hence, there is no need to push the HW (hardware) specifications way beyond what is needed in a normal communication use-case. There is also no need to impose new, stringent, or costly changes to the chip scope (CS) to improve the CS absolute gain accuracy. As an example, this enhancement in the CS accuracy can allow the CS to replace, in a production test, the external oscilloscope for measurement of the IC's capability. This will save the cost of the external oscilloscope, as well as significantly reduce the test time, since doing the test internally within the chip eliminates the need to control an external test equipment (oscilloscope), read out measured data (a trace), and then do correction of the data on a test-station controller.

Figure 2:
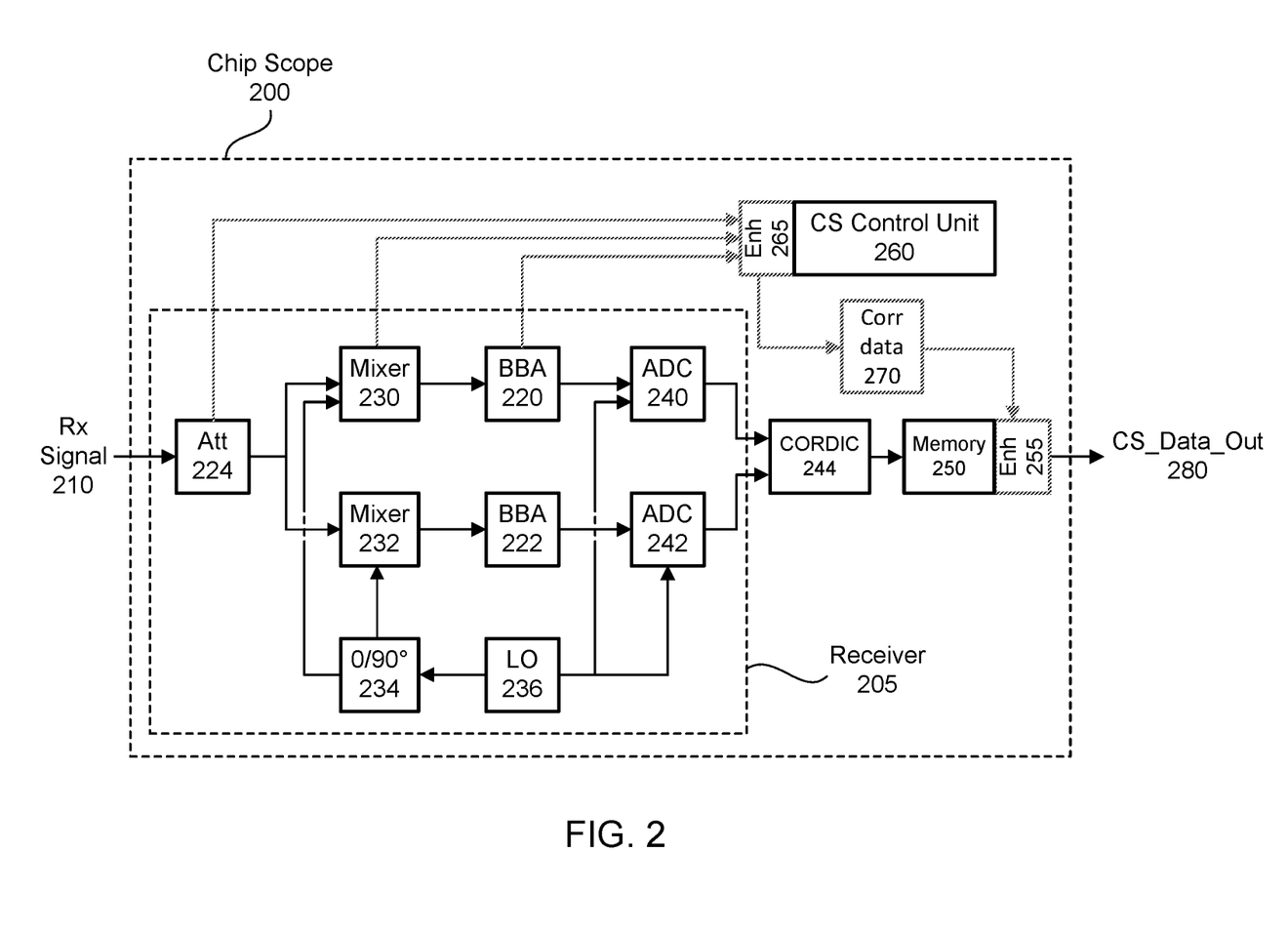
FIG. 2 shows a functional block diagram of an enhanced chip integrated scope (i.e., chip scope (CS)) using correction data to compensate for circuit variations (occurring between different units of the device) in accordance with some embodiments of the invention.

In some embodiments, in order to enhance the resolution and accuracy of the CS, raw and correction data are used to compensate for gain/phase errors from the analog/RF blocks in the Rx path. FIG. 2 shows an embodiment of how this enhancement can be implemented using additional control in the CS Control Unit, Correction Data, and additional Enhanced Memory.

In this regard, FIG. 2 shows a functional block diagram of an enhanced chip integrated scope (i.e., chip scope (CS)) using correction data to compensate for circuit variations (occurring between different units of the device) in accordance with some embodiments of the invention. By "different units of the device", this specification means different units of the same chip scope (CS) device. This is because each manufactured unit of a chip scope (CS) device is expected to have circuit variations due to different IC die used, process variations, manufacturing variations, etc.

The chip scope (CS) 200 shown in FIG. 2 is similar to the chip scope (CS) 100 shown in FIG. 1. For example, the chip scope (CS) 200 receives a Rx (receiver) signal 210 as input, and then transmits a CS_Data_Out 280 as output. In other words, the CS 200 receives a RF (radio frequency) signal (e.g., Rx signal 210), and then transmits out a digital data sample (e.g., CS_Data_Out 280). Additionally, the chip scope (CS) 200 of FIG. 2 includes a receiver 205, a CS Control Unit 260, a CORDIC 244, and a memory 250. Furthermore, the receiver 205 includes an attenuator 224, two Mixers (230, 232), two BBA (220, 222), two ADC (240, 242), a LO 236, and an I/Q LO unit (labeled as a 0/90° unit 234).

However, chip scope (CS) 200 of FIG. 2 includes these new enhancement features, as compared with chip scope (CS) 100 of FIG. 1: (a) additional controls (265) in the CS control unit 260, (b) correction data stored in a correction data memory (270), and (c) an enhancement 255 applied to memory 250.

The function of these enhancements is that, during CS capture of the raw digital data sample, the CS control unit 260 requests status (or state) information from the attenuator, the BBA, and the mixer in terms of a gain relevant setting. These gain relevant settings are used to fetch the respective compensation (or correction) data for the relevant functional blocks from the correction data memory 270, which in turn are exact and per part measured gain data during IC production test. Here, the state information is based on the gain setting of the attenuator, the BBA, and the mixer. In other embodiments, the state information can be based on the gain, phase and/or non-linearities setting/errors from functional blocks in the receiver. Here, the relevant functional blocks are the attenuator, the BBA, and the mixer. In other embodiments, other functional blocks can be relevant. In still other embodiments, the attenuator, the BBA, and the mixer may no longer be relevant functional blocks, if they are receiving signals from sources internal to the device. Here, the respective compensation (or correction) data that is fetched can correspond to "an appropriate subset of the correction data to apply to the raw digital data sample to compensate for circuit variations". Here, "per part measured" means measured per unit of a chip scope (CS) device.

The correction data memory is a memory storing all compensation (or correction) data for the relevant blocks involved in the Rx (receive) path. For an instantaneous correction, the data set corresponding to the Rx path configuration is selected and transferred to a dedicated correction register (memory) as part of the correction. Here, in FIG. 2, the relevant blocks are the attenuator, the BBA, and the mixer. In other embodiments, other functional blocks can be relevant. In still other embodiments, the attenuator, the BBA, and the mixer may no longer be relevant functional blocks, if they are receiving signals from sources internal to the device. Here, the data set corresponding to the Rx path configuration can correspond to "an appropriate subset of the correction data to apply to the raw digital data sample to compensate for circuit variations". Here, a dedicated correction register (memory) can be the enhanced memory 255.

The production test data relevant for the data samples during a CS capture are stored along with the (uncompensated) CS raw data samples (or immediately processed as correction to the raw data samples to generate compensated data samples). Here, the production test data relevant for the data samples can be the correction data stored in a correction data memory (270). Here, the (uncompensated) CS raw data samples can be the "raw digital data sample". Here, "processed as correction to the raw data samples to generate compensated data samples" can mean "the appropriate subset of the correction data is applied to the raw digital data sample to generate a compensated digital data sample".

In other words, the additional controls (265) in the CS control unit 260 can receive inputs from the receiver 205, and then use the inputs to determine an appropriate subset of the correction data to apply to the raw digital data sample to compensate for circuit variations. In some embodiments, the inputs from the receiver are information related to a state (or status) of the receiver. In some embodiments, the circuit variations are due to gain, phase, and/or non-linearities errors from functional blocks in the receiver. In some embodiment, a state (or status) of the receiver can be based on a gain, phase, and/or non-linearities setting/error from functional blocks in the receiver.

In FIG. 2, the inputs from the receiver 205 are coming from the following functional blocks of the receiver: (i) the attenuator 224, (ii) the mixer (230, 232), and (iii) the BBA (220, 222). In some embodiments, the CS control unit 260 can receive the inputs from one or more of the following functional blocks of the receiver 205: (i) the attenuator 224, (ii) the mixer (230, 232), (iii) the BBA (220, 222), (iv) the ADC (240, 242). In some embodiments, the inputs from the one or more functional blocks of the receiver are information related to a state of the receiver.

FIG. 2 shows an enhancement 255 applied to memory 250. In some embodiments, the enhancement 255 applied to memory 250 can be an enhancement memory 255 attached to a digital data memory 250. In that case, the appropriate subset of the correction data (to be applied to the raw digital data sample to compensate for circuit variations) can be stored together with the raw digital data sample in the digital data memory so that a post processing step is needed to generate a compensated digital data sample. In some embodiments, the appropriate subset of the correction data can be stored in the enhancement memory 255 and the raw digital data sample can be stored in the digital data memory 250. Then a post processing step is needed to generate a compensated digital data sample. In some embodiments, the enhancement 255 applied to memory 250 can be simply a memory enhancement 255 applied to the digital data memory 250, so that the appropriate subset of the correction data (to be applied to the raw digital data sample to compensate for circuit variations) can be stored together with the raw digital data sample in the digital data memory so that a post processing step is needed to generate a compensated digital data sample.

If the production test data relevant for the data samples during a CS capture and the (uncompensated) CTS raw data samples are stored separately, then a post-processing step needs to take place to apply the compensation. This scenario is shown in FIG. 3.

Figure 3:
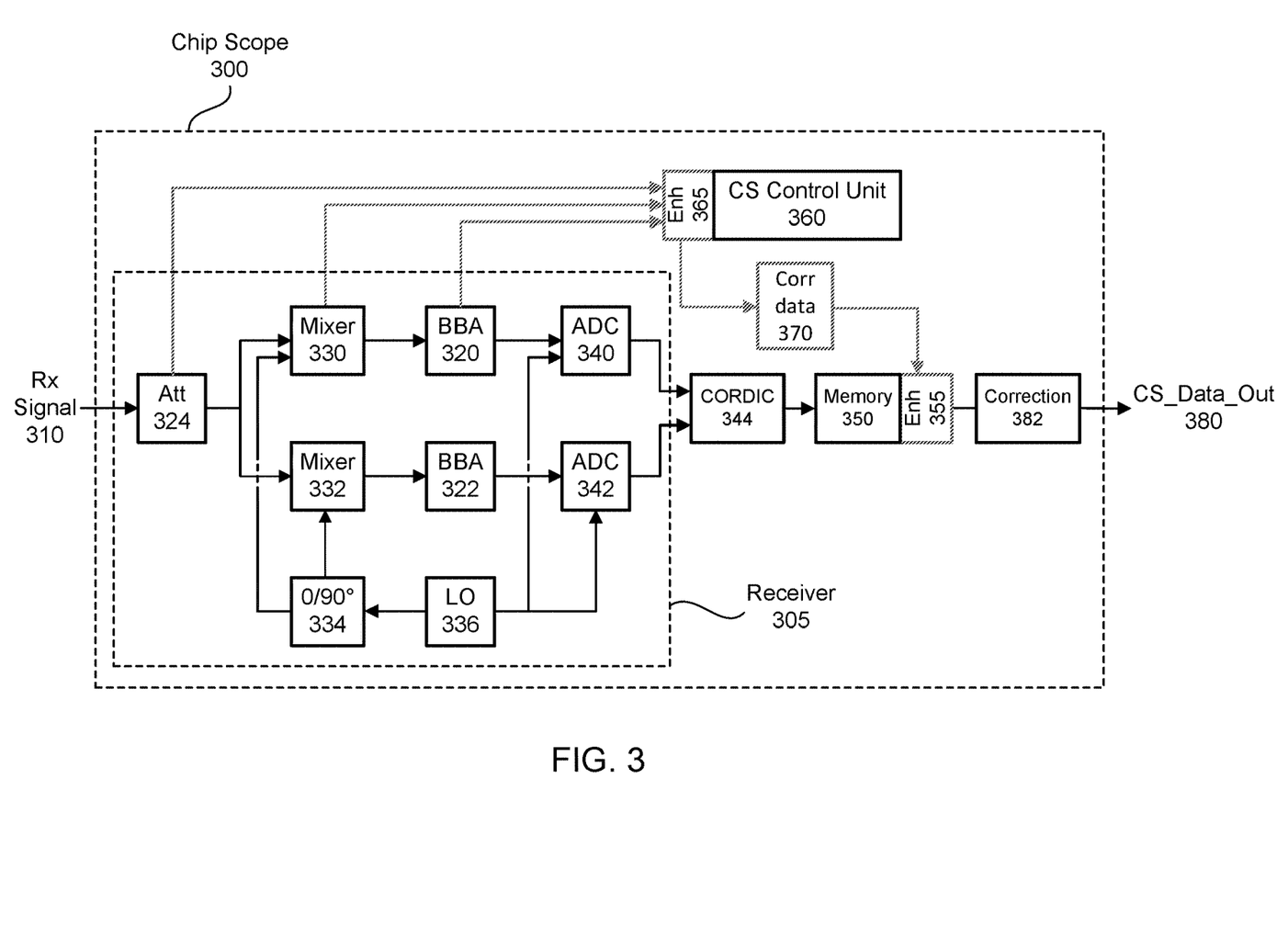
FIG. 3 shows a functional block diagram of an enhanced chip integrated scope (i.e., chip scope (CS)) using correction data to compensate for circuit variations (occurring between different units of the device), where the compensation processing is performed within the chip integrated scope, in accordance with some embodiments of the invention.

In this regard, FIG. 3 shows a functional block diagram of an enhanced chip integrated scope (i.e., chip scope (CS)) using correction data to compensate for circuit variations (occurring between different units of the device), where the compensation processing is performed within the chip integrated scope, in accordance with some embodiments of the invention.

The chip scope (CS) 300 shown in FIG. 3 is similar to the chip scope (CS) 200 shown in FIG. 2. For example, the chip scope (CS) 300 receives a Rx (receiver) signal 310 as input, and then transmits a CS_Data_Out 380 as output. Additionally, the chip scope (CS) 300 of FIG. 3 includes a receiver 305, a CS Control Unit 360, a CS Control Unit enhancement 365, a CORDIC 344, a memory 350, an enhancement memory 355, and correction data stored in a correction data memory (370). Furthermore, the receiver 305 includes an attenuator 324, two Mixers (330, 332), two BBA (320, 322), two ADC (340, 342), a LO 336, and an I/Q LO unit (labeled as a 0/90° unit 334).

However, chip scope (CS) 300 of FIG. 3 includes this new enhancement feature, as compared with chip scope (CS) 200 of FIG. 2: (a) a correction processor 382.

As stated earlier, if the production test data relevant for the data samples during a CS capture and the (uncompensated) CTS raw data samples are stored separately, then a post-processing step 382 needs to take place to apply the compensation.

Consequently, in some embodiments, the appropriate subset of the correction data can be applied to the raw digital data sample to generate a compensated digital data sample (CS_Data_Out 380), wherein the compensated digital data sample (CS_Data_Out 380) can be then directly available as an immediate output from the device or the compensated digital data sample can be stored in the digital data memory for future output.

In some embodiments, the appropriate subset of the correction data is stored together with the raw digital data sample in the digital data memory so that a post processing step 382 is needed to generate a compensated digital data sample.

In some embodiments, the appropriate subset of the correction data is applied to the raw digital data sample to generate a compensated digital data sample using one of the following methods: (a) hardware, (b) software, (c) a combination of hardware and software. Hence, in some embodiments, the correction processor 382 can be implemented as: (a) hardware (e.g., a hardware block), (b) software (e.g., a software algorithm), (c) a combination of hardware and software.

In some embodiments, a chip scope may do no correction, but provide the raw data (e.g., raw digital data sample) and the correction data to a higher logical layer (host) where the post-processing is done In some embodiments, a chip scope may store the "correction data" as raw data copied from a production test memory. In some embodiments, the correction data is generated from one or more of the following: (a) simulation data, (b) characterization data, (c) production test data.

In some embodiments, a chip scope may pre-process the "correction data" into a single compensation value which in turn is stored or processed. In some embodiments, each of the appropriate subset of the correction data is pre-processed to become a single compensation value that can be applied to the raw digital data sample.

Figure 4:
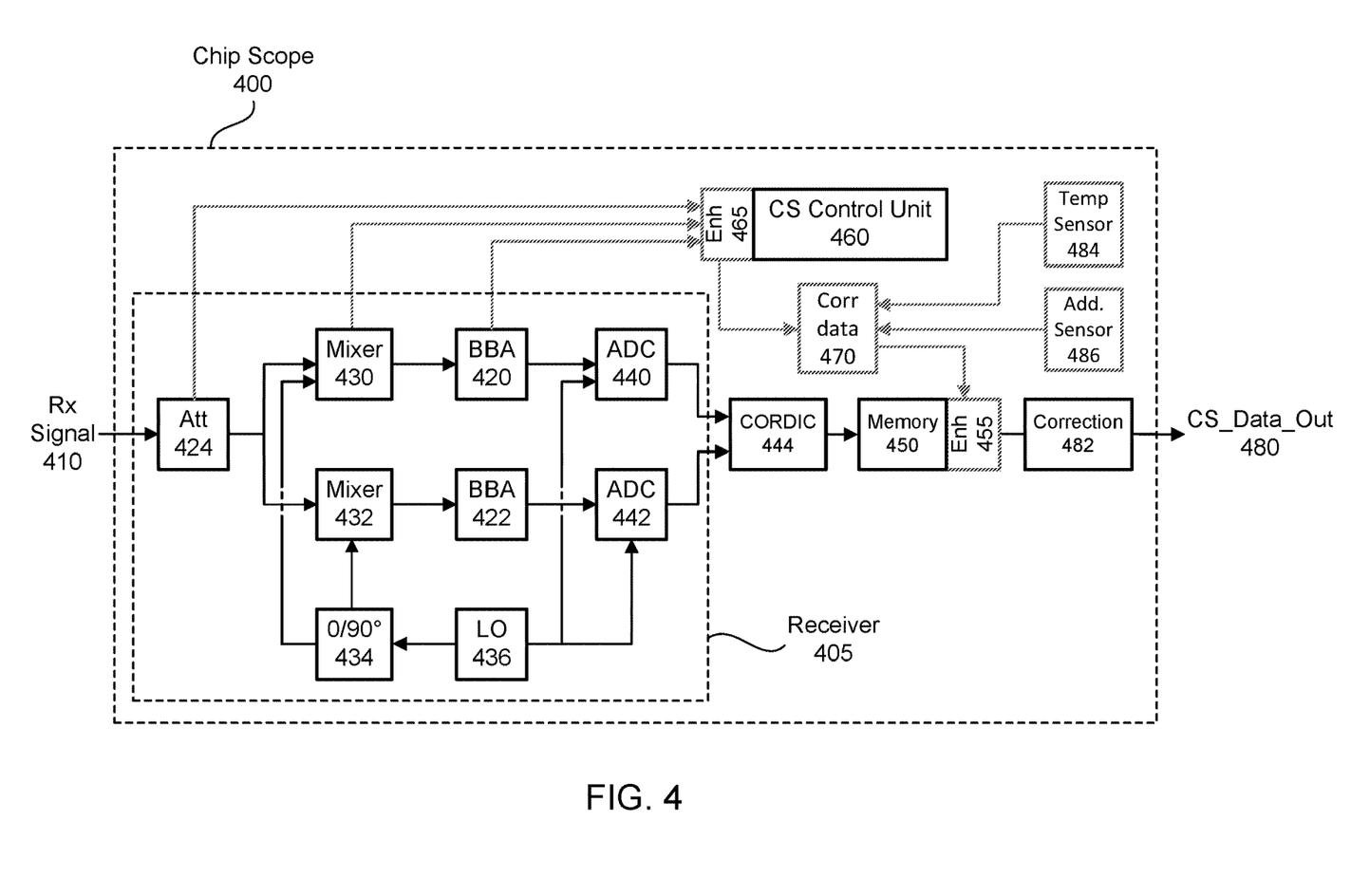
FIG. 4 shows a functional block diagram of an enhanced chip integrated scope (i.e., chip scope (CS)) using correction data to compensate for circuit variations (occurring between different units of the device), where the compensation processing is performed within the chip integrated scope and additional sensor data is also used for the compensation processing, in accordance with some embodiments of the invention.

In the block diagram of FIG. 4 addition sensor information may be used for correction/compensation. As the die temperature has impact on analog/RF blocks (biasing, mixer gain, BBA gain and phase), this is valuable information to know and compensate for. As shown in FIG. 4, for example, a temperature sensor can be used to detect the die temperature during the CS capture which in turn is used to select or calculate the proper compensation using the "correction data".

In this regard, FIG. 4 shows a functional block diagram of an enhanced chip integrated scope (i.e., chip scope (CS)) using correction data to compensate for circuit variations (occurring between different units of the device), where the compensation processing is performed within the chip integrated scope and additional sensor data is also used for the compensation processing, in accordance with some embodiments of the invention. The chip scope (CS) 400 shown in FIG. 4 is similar to the chip scope (CS) 300 shown in FIG. 3, except FIG. 4 includes these new enhancement features: (a) temperature sensor 484, and (b) additional sensor 486. Otherwise, all FIG. 4 components operate and behave in a similar manner as their corresponding counterpart components in FIG. 3.

In some embodiments, a temperature sensor detects a temperature of the device, wherein the temperature of the device is used for determining the appropriate subset of the correction data to applied to the raw digital data sample.

Figure 5:
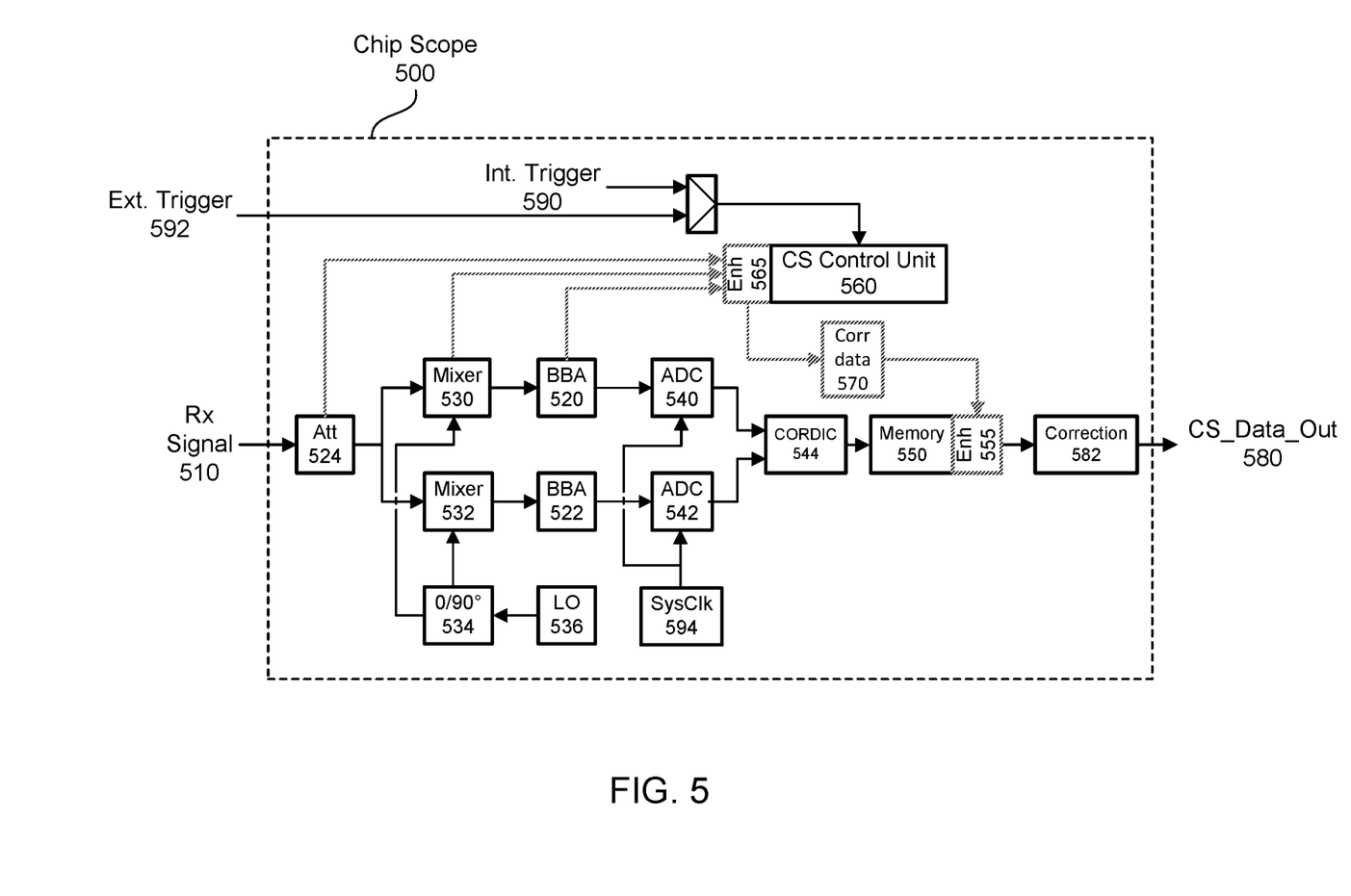
FIG. 5 shows a functional block diagram of an enhanced chip integrated scope (i.e., chip scope (CS)) using correction data to compensate for circuit variations (occurring between different units of the device), where the compensation processing is performed within the chip integrated scope and there are trigger signal inputs, in accordance with some embodiments of the invention.

In the block diagram of FIG. 5, additional triggers (i.e., internal and external triggers) may be used to send a trigger signal to the CS control unit. For example, these additional triggers can provide an oscilloscope's trigger function, which is important to achieve clear signal characterization, as it synchronizes the horizontal sweep of the oscilloscope to the proper point of the signal. The trigger control enables users to stabilize repetitive waveforms as well as capture single-shot waveforms. Additionally, these additional triggers may be able to provide other functions and benefits.

In this regard, FIG. 5 shows a functional block diagram of an enhanced chip integrated scope (i.e., chip scope (CS)) using correction data to compensate for circuit variations (occurring between different units of the device), where the compensation processing is performed within the chip integrated scope and there are trigger signal inputs, in accordance with some embodiments of the invention. The chip scope (CS) 500 shown in FIG. 5 is similar to the chip scope (CS) 300 shown in FIG. 3, except FIG. 5 includes these new enhancement features: (a) an internal trigger 590, (b) an external trigger 592, (c) a mux (or multiplexer) to select between the internal and external triggers as input to the CS control unit 560, and (d) system clock 594. Otherwise, all FIG. 5 components operate and behave in a similar manner as their corresponding counterpart components in FIG. 3.

The internal trigger 590 is a data signal from a source internal to the CS device 500. The external trigger 592 is a data signal from a source external to the CS device 500. In some embodiments, a trigger is based on a signal the CS control unit receives from one of the following sources: (a) a source external to the device, (b) a source internal to the device, (c) a combination of a source external to the device and a source internal to the device.

Figure 6:
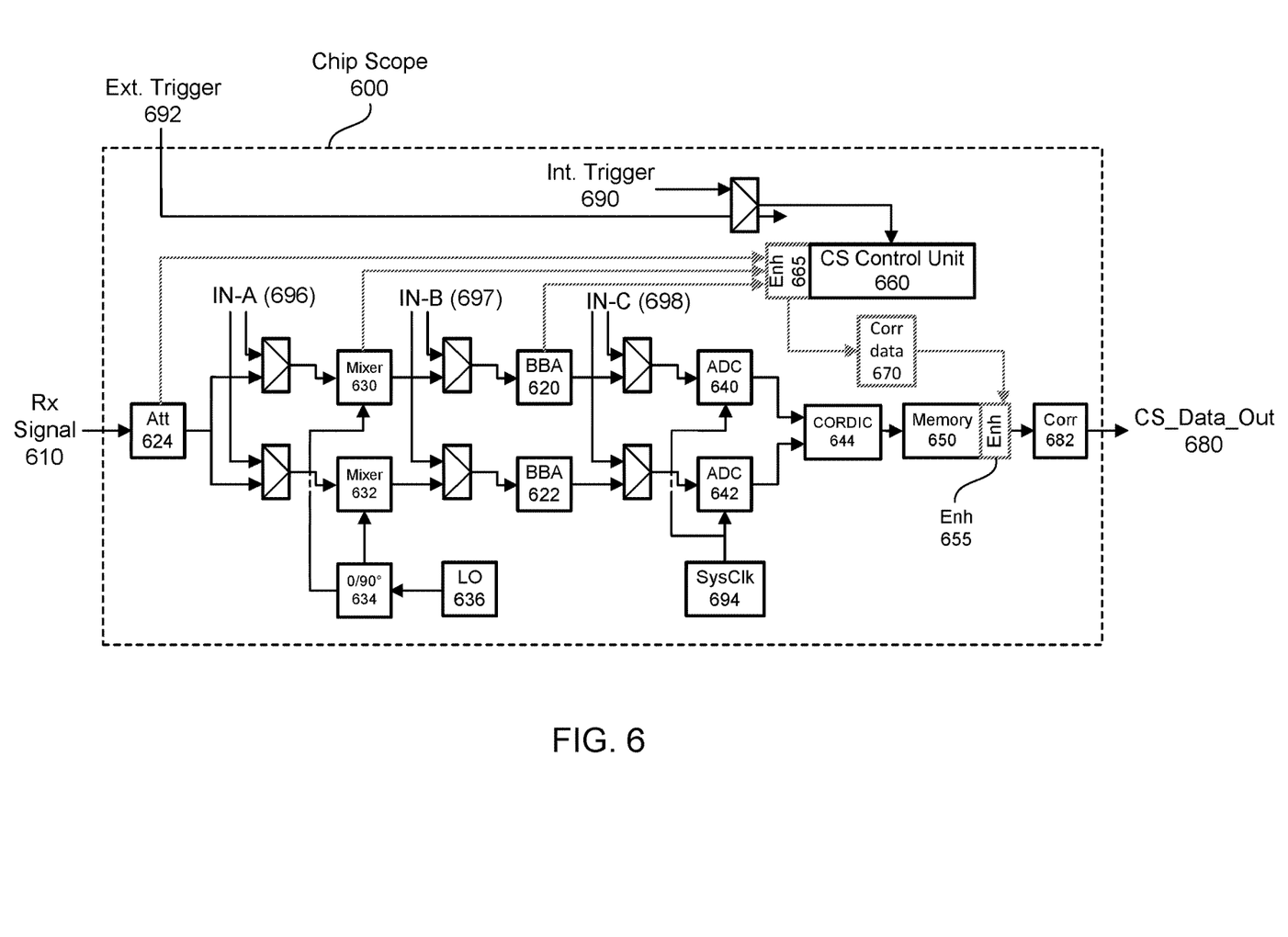
FIG. 6 shows a functional block diagram of an enhanced chip integrated scope (i.e., chip scope (CS)) using correction data to compensate for circuit variations (occurring between different units of the device), where the compensation processing is performed within the chip integrated scope and there are trigger signal inputs and signal feeds from sources internal to the chip, in accordance with some embodiments of the invention.

In some embodiments, a chip scope (CS) can allow signals to be introduced at the attenuator or the mixer input. In some embodiments, the signal of interest can also be introduced at the ADC, BBA, mixer, or attenuator inputs (e.g., using a bypass of mixer or BBA, mux (or multiplexer), etc.). This is shown in FIG. 6. In the block diagram of FIG. 6, additional data signals can be introduced at the ADC, BBA, or mixer inputs. (Note: additional data signals can also be introduced at the attenuator input, but this is not shown in FIG. 6.)

In this regard, FIG. 6 shows a functional block diagram of an enhanced chip integrated scope (i.e., chip scope (CS)) using correction data to compensate for circuit variations (occurring between different units of the device), where the compensation processing is performed within the chip integrated scope and there are trigger signal inputs and signal feeds from sources internal to the chip, in accordance with some embodiments of the invention. The chip scope (CS) 600 shown in FIG. 6 is similar to the chip scope (CS) 500 shown in FIG. 5, except FIG. 6 includes these new enhancement features: (a) signal feeds from sources internal to the chip (IN-A 696, IN-B 697, IN-C 698), and (b) a mux (or multiplexer) to select between the internal and external signal feeds. IN-A 696 is a signal feed to the mixer through a mux. IN-B 697 is a signal feed to the BBA through a mux. IN-C 698 is a signal feed to the ADC through a mux.

Otherwise, all FIG. 6 components operate and behave in a similar manner as their corresponding counterpart components in FIG. 5.

In some embodiments, the raw digital data sample is based on signals the receiver receives from one of the following sources: (a) sources external to the device (e.g. Rx signal 610), (b) sources internal to the device (e.g., IN-A 696, IN-B 697, IN-C 698), (c) a combination of sources external to the device and sources internal to the device. In some embodiments, the receiver receives signals from sources internal to the device via one or more of the following functional blocks of the receiver: (a) the attenuator, (b) the mixer (e.g., IN-A 696), (c) the BBA (e.g., IN-B 697), (d) the ADC (e.g., IN-C 698).

In one embodiment the CS input data may be from IC external source.

In one embodiment the CS input data may be from IC internal source.

In one embodiment the CS input data may be fed into the attenuator.

In one embodiment the CS input data may be fed into the mixer.

In one embodiment the CS input data may be fed into the BBA.

In one embodiment the CS input data may be fed into the ADC.

Figure 7:
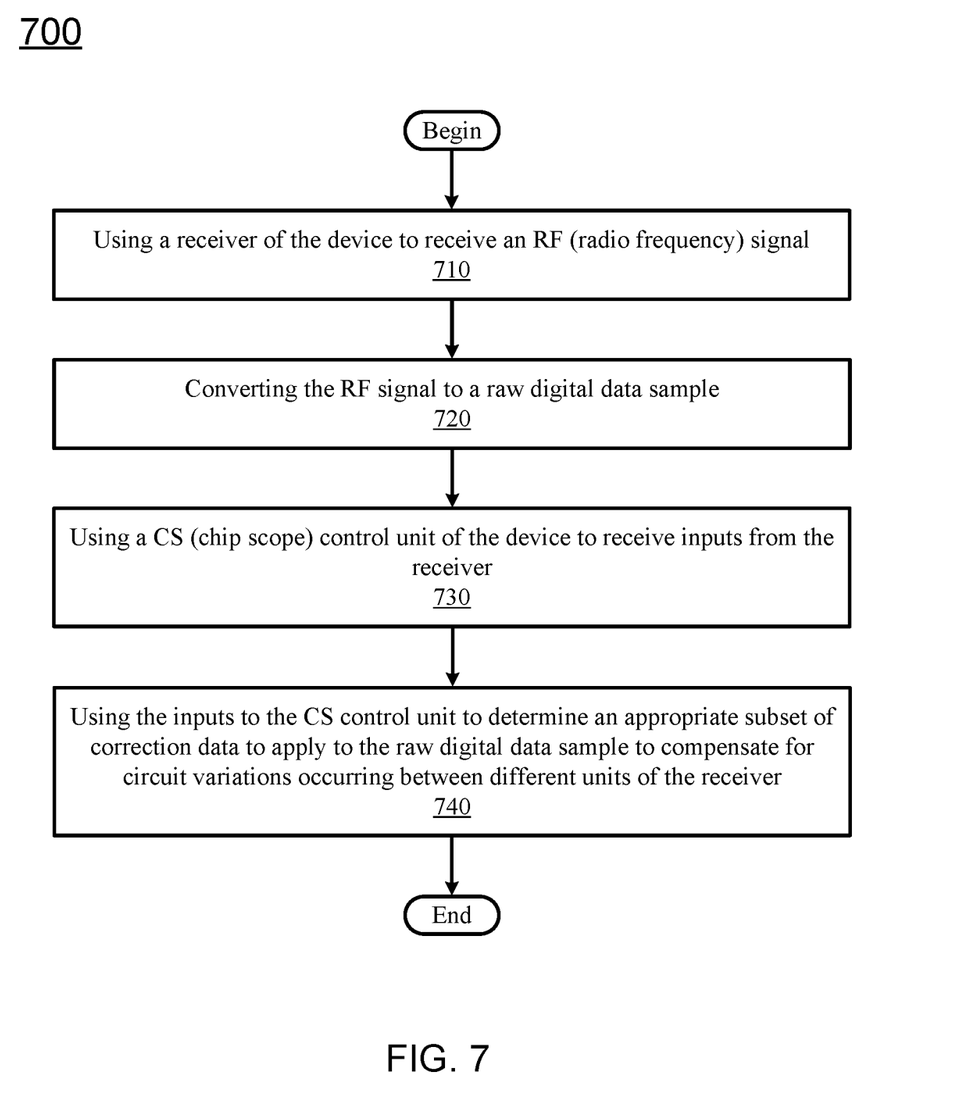
FIG. 7 shows a process flow diagram of a method to enhance accuracy and resolution of a chip integrated scope (i.e., chip scope (CS)) by using correction data to compensate for circuit variations (occurring between different units of the device) in accordance with some embodiments of the invention.

FIG. 7 shows a process flow diagram of a method to enhance accuracy and resolution of a chip integrated scope (i.e., chip scope (CS)) by using correction data to compensate for circuit variations (occurring between different units of the device) in accordance with some embodiments of the invention. As shown in FIG. 7, the method 700 begins at step 710, where the method uses a receiver of the device to receive an RF (radio frequency) signal. Then, the method proceeds to step 720. In step 720, the method converts the RF signal to a raw digital data sample. Next, at step 730, the method uses a CS (chip scope) control unit of the device to receive inputs from the receiver. Finally, at step 740, the method uses the inputs to the CS control unit to determine an appropriate subset of correction data to apply to the raw digital data sample to compensate for circuit variations occurring between different units of the receiver.

In this specification, example embodiments have been presented in terms of a selected set of details. However, a person of ordinary skill in the art would understand that many other example embodiments may be practiced which include a different selected set of these details. It is intended that the following claims cover all possible example embodiments.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

The computer-useable or computer-readable medium can be an electronic, magnetic, optical, electromagnetic, infrared, or semiconductor system (or apparatus or device), or a propagation medium. Examples of a computer-readable medium include a semiconductor or solid-state memory, magnetic tape, a removable computer diskette, a random access memory (RAM), a read-only memory (ROM), a rigid magnetic disc, and an optical disc. Examples of optical discs include a compact disc with read only memory (CD-ROM), a compact disc with read/write (CD-R/W), a digital video disc (DVD), and a Blu-ray disc.

The various aspects, embodiments, implementations or features of the described embodiments can be used separately or in any combination. Various aspects of the described embodiments can be implemented by software, hardware or a combination of hardware and software.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A device for receiving a RF (radio frequency) signal and converting the RF signal to a digital data sample, the device comprising:
   a digital data memory;
   a receiver, the receiver configured to providing a raw digital data sample to the digital data memory;
   a correction data memory configured to store correction data, wherein the correction data is used to correct the raw digital data sample for errors caused by circuit variations between different units of the receiver;
   a CS (chip scope) control unit, the CS control unit configured to request and receive gain settings from the receiver, the CS control unit further configured to using the received gain settings to determine an appropriate subset of the correction data to apply to the raw digital data sample to correct the errors caused by circuit variations.

2. The device of claim 1, wherein the errors comprise gain, phase, and/or non-linearities errors due to variations in functional blocks in the receiver.

3. The device of claim 1, wherein the receiver is configured for receiving the RF signal for an NFC-enabled device, wherein NFC stands for near field communication.

4. The device of claim 1, wherein the receiver is comprised of:
   a down converter,
   an ADC (analog to digital converter).

5. The device of claim 4, wherein the receiver is further comprised of one or more of the following:
   an attenuator,
   a BBA (baseband amplifier),
   a filter.

6. The device of claim 5,
   wherein the down converter is comprised of one or more of the following:
      a mixer,
      a LO (local oscillator),
      an I/Q LO unit,
   wherein the device is further comprised of a CORDIC (Coordinate Rotation Digital Computer), wherein the CORDIC is configured to processing the raw digital data sample from the receiver before sending the raw digital data sample to the digital data memory.

7. The device of claim 6, wherein the CS control unit receives the gain settings from one or more of the following functional blocks of the receiver:
the attenuator,
the mixer,
the BBA,
the ADC.

8. The device of claim 1, wherein the raw digital data sample is based on signals the receiver receives from one of the following sources:
sources external to the device,
sources internal to the device,
a combination of sources external to the device and sources internal to the device.

9. The device of claim 8, wherein the receiver receives signals from sources internal to the device via one or more of the following functional blocks of the receiver:
the attenuator,
the mixer,
the BBA,
the ADC.

10. The device of claim 1,
wherein the appropriate subset of the correction data is applied to the raw digital data sample to generate a compensated digital data sample,
wherein the compensated digital data sample is then directly available as an immediate output from the device or the compensated digital data sample is stored in the digital data memory for future output.

11. The device of claim 1,
wherein the appropriate subset of the correction data is stored together with the raw digital data sample in the digital data memory so that a post processing step is needed to generate a compensated digital data sample.

12. The device of claim 1,
wherein the appropriate subset of the correction data is applied to the raw digital data sample to generate a compensated digital data sample using:
hardware,
software, or
a combination of hardware and software.

13. The device of claim 1, wherein each of the appropriate subset of the correction data is pre-processed to become a single compensation value that can be applied to the raw digital data sample.

14. The device of claim 1, wherein the correction data is generated from one or more of the following:
simulation data,
characterization data,
production test data.

15. The device of claim 1, wherein a temperature sensor detects a temperature of the device, wherein the temperature of the device is used for determining the appropriate subset of the correction data to applied to the raw digital data sample.

16. A method to enhance accuracy and resolution of a chip integrated scope of a device, the method comprising:
using a receiver of the device to receive an RF (radio frequency) signal;
converting the RF signal to a raw digital data sample;
using a CS (chip scope) control unit of the device to receive gain settings from a mixer and an amplifier of the receiver,
the CS control unit using the gain settings to determine an appropriate subset of correction data to apply to the raw digital data sample to correct the raw digital data sample for gain errors caused by circuit variations of the receiver.

17. The method of claim 16, wherein the raw digital data sample is a RF signal trace, wherein the inputs from the receiver are information related to a state of the receiver.

18. The method of claim 16 further comprising:
applying the appropriate subset of the correction data to the raw digital data sample to generate a compensated digital data sample,
wherein the compensated digital data sample is then directly available as an immediate output from the device or the compensated digital data sample is stored in a digital data memory for future output.

19. A computer program product comprising executable instructions encoded in a non-transitory computer readable medium which, when executed by a system that receives and converts an RF (radio frequency) signal to a raw digital sample, carry out or control a method, the method comprising:
receive gain settings from a mixer and an amplifier of a receiver of the system,
using the gain settings to determine an appropriate subset of correction data to apply to the raw digital data sample to correct the raw digital data sample for gain errors caused by circuit variations between different units of the receiver.

* * * * *